United States Patent
Azizi et al.

(10) Patent No.: US 11,791,800 B2
(45) Date of Patent: *Oct. 17, 2023

(54) APPARATUS AND METHODS FOR PHASE SHIFTING

(71) Applicant: Skyworks Solutions, Inc., Irvine, CA (US)

(72) Inventors: Mostafa Azizi, Stittsville (CA); Hassan Sarbishaei, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/455,086

(22) Filed: Nov. 16, 2021

(65) Prior Publication Data

US 2022/0200577 A1 Jun. 23, 2022

Related U.S. Application Data

(60) Provisional application No. 63/199,397, filed on Dec. 23, 2020.

(51) Int. Cl.
*H03H 11/16* (2006.01)
*H04B 3/20* (2006.01)
*H04L 27/00* (2006.01)

(52) U.S. Cl.
CPC ............ *H03H 11/16* (2013.01); *H04B 3/20* (2013.01); *H04L 27/0002* (2013.01)

(58) Field of Classification Search
CPC ...... H03H 11/16; H03H 11/20; H03H 11/265; H03H 17/0009; H03H 17/0054; H03H 17/08; H04B 3/20; H04L 2/002

USPC ......................................................... 375/257
See application file for complete search history.

(56) References Cited

U.S. PATENT DOCUMENTS

| | | |
|---|---|---|
| 4,675,624 A | 6/1987 | Rosen et al. |
| 4,675,628 A | 6/1987 | Rosen |
| 5,130,717 A | 7/1992 | Ewen et al. |
| 5,180,998 A | 1/1993 | Willems |

(Continued)

FOREIGN PATENT DOCUMENTS

| | | |
|---|---|---|
| GB | 2162375 | 1/1986 |
| KR | 10-2012-0135762 | 12/2012 |

OTHER PUBLICATIONS

Gharehkhani et al., "A new structure for 6 bit distributed MEMS transmission line phase shifter in ku band", IJE Transactions B: Applications, vol. 31 (2):315-321 (2018).

(Continued)

*Primary Examiner* — Kevin M Burd
(74) *Attorney, Agent, or Firm* — Knobbe, Martens, Olson & Bear, LLP

(57) ABSTRACT

Apparatus and methods for phase shifting are provided herein. In certain embodiments, a phase shifter includes a first port, a first controllable reflective load, a second port, a second controllable reflective load, and a pair of coupled lines that are electromagnetically coupled to one another. The pair of coupled lines includes a first conductive line between the first port and the first controllable reflective load and a second conductive line between the second controllable reflective load and the second port. At least one of the first controllable reflective load or the second controllable reflective load includes a switched transmission line load.

20 Claims, 11 Drawing Sheets

(56) References Cited

U.S. PATENT DOCUMENTS

| | | | |
|---|---|---|---|
| 5,410,499 A | 4/1995 | Waters | |
| 6,320,481 B1 | 11/2001 | Sharma | |
| 6,609,003 B1 | 8/2003 | Park et al. | |
| 7,173,503 B1 | 2/2007 | Cadotte, Jr. | |
| 7,880,685 B2 | 2/2011 | Norvell et al. | |
| 7,907,100 B2 | 3/2011 | Mortazawi et al. | |
| 8,195,118 B2 | 6/2012 | Warnick | |
| 8,593,219 B1 | 11/2013 | Root | |
| 8,610,515 B2 | 12/2013 | Lan et al. | |
| 8,737,531 B2 | 5/2014 | Saunders | |
| 8,837,632 B2 | 9/2014 | Saunders | |
| 9,213,091 B2 | 12/2015 | Kishigami et al. | |
| 9,264,913 B2 | 2/2016 | Tsukizawa et al. | |
| 9,543,915 B1 | 1/2017 | Bonebright et al. | |
| 9,570,796 B2 | 2/2017 | Alrabadi et al. | |
| 9,667,467 B2 | 5/2017 | Bonebright et al. | |
| 9,887,589 B2 | 2/2018 | Williams et al. | |
| 10,062,946 B2 | 8/2018 | Sharma et al. | |
| 10,163,889 B2 | 12/2018 | Mayer et al. | |
| 10,256,538 B2 | 4/2019 | Bonebright et al. | |
| 10,637,289 B2 | 4/2020 | Williams et al. | |
| 2007/0286190 A1 | 12/2007 | Denzel et al. | |
| 2008/0198903 A1 | 8/2008 | Kawai | |
| 2009/0278624 A1 | 11/2009 | Tsai et al. | |
| 2010/0171567 A1* | 7/2010 | Krishnaswamy | H01P 1/185 |
| | | | 333/164 |
| 2015/0270821 A1 | 9/2015 | Natarajan et al. | |
| 2019/0296718 A1* | 9/2019 | Birkbeck | H03H 11/265 |
| 2020/0411984 A1 | 12/2020 | Fitzgerald et al. | |
| 2021/0098886 A1 | 4/2021 | Qi et al. | |
| 2021/0391903 A1 | 12/2021 | Jam et al. | |
| 2021/0391904 A1 | 12/2021 | Jam et al. | |
| 2022/0200560 A1 | 6/2022 | Azizi et al. | |

OTHER PUBLICATIONS

Maloratsky, "Electrically tunable switched-line diode phase shifters Part 2: Multi-section circuits", High Frequency Electronics, pp. 60-66 (2010).

Shrivastava et al., "Compact K-Band Lange Coupler Based 2-Bit RF MEMS Reflection-Type Phase Shifter", Centre of Applied Research in Electronics, Indian Institute of Technology, Delhi, India, downloaded on Jun. 21, 2023, in 4 pages.

* cited by examiner

APPARATUS AND METHODS FOR PHASE SHIFTING

CROSS-REFERENCE TO RELATED APPLICATIONS

This application claims the benefit of priority under 35 U.S.C. § 119 of U.S. Provisional Patent Application No. 63/199,397, filed Dec. 23, 2020, and titled "PHASE SHIFTERS WITH SWITCHED TRANSMISSION LINE LOADS," which is herein incorporated by reference in its entirety.

BACKGROUND

Technical Field

Embodiments of the invention relate to electronic systems, and in particular, to radio frequency (RF) electronics.

Description of the Related Technology

Phase shifters are used in RF communication systems to control the phase of RF signals transmitted or received wirelessly via antennas.

Examples of RF communication systems with one or more phase shifters include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

SUMMARY

In certain embodiments, the present disclosure relates to a phase shifter. The phase shifter includes a first port, a second port, a first controllable reflective load including a first transmission line and a first plurality of shunt switches connected along the first transmission line, a second controllable reflective load, and a pair of coupled lines that are electromagnetically coupled to one another. The pair of coupled lines including a first conductive line connected between the first port and the first controllable reflective load and a second conductive line connected between the second controllable reflective load and the second port.

In some embodiments, the first controllable reflective load further includes a first ground conductor on a first side of the first transmission line and a second ground conductor on a second side of the first transmission line. According to a number of embodiments, each of the first plurality of shunt switches is implemented as a pair of field-effect transistors including a first field-effect transistor connected between the first transmission line and the first ground conductor and a second field-effect transistor connected between the first transmission line and the second ground conductor.

In several embodiments, one or more of the first plurality of shunt switches are closed based on a phase shifting setting of the phase shifter.

In various embodiments, the first port receives a radio frequency input signal and the second port provides a phase-shifted radio frequency output signal.

In some embodiments, the second port receives a radio frequency input signal and the first port provides a phase-shifted radio frequency output signal.

In several embodiments, the first plurality of shunt switches are connected to the first transmission line at a plurality of points having uniform distance from one another.

In various embodiments, the first plurality of shunt switches are connected to the first transmission line at a plurality of points having non-uniform distance from one another. According to a number of embodiments, the distance between adjacent pairs of the plurality of points gradually decreases along a length of the first transmission line.

In some embodiments, the first plurality of shunt switches each have a common size.

In several embodiments, the first plurality of shunt switches each have a different size. According to a number of embodiments, the size of the first plurality of shunt transistors gradually increases along a length of the first transmission line.

In various embodiments, the first transmission line includes a plurality of meandering sections. In accordance with some embodiments, at least one of the plurality of meandering sections includes a loop.

In several embodiments, the second controllable reflective load includes a second transmission line and a second plurality of shunt switches connected along the second transmission line.

In some embodiments, the phase shifter further includes a hybrid coupler including the pair of coupled lines.

In certain embodiments, the present disclosure relates to a wireless device. The wireless device includes a transceiver, and a front-end system coupled to the transceiver. The front-end system includes a phase shifter including a first port, a second port, a first controllable reflective load including a first transmission line and a first plurality of shunt switches connected along the first transmission line, a second controllable reflective load, and a pair of coupled lines that are electromagnetically coupled to one another. The pair of coupled lines includes a first conductive line connected between the first port and the first controllable reflective load and a second conductive line connected between the second controllable reflective load and the second port.

In various embodiments, the first controllable reflective load further includes a first ground conductor on a first side of the first transmission line and a second ground conductor on a second side of the first transmission line. According to a number of embodiments, each of the first plurality of shunt switches is implemented as a pair of field-effect transistors including a first field-effect transistor connected between the first transmission line and the first ground conductor and a second field-effect transistor connected between the first transmission line and the second ground conductor.

In several embodiments, one or more of the first plurality of shunt switches are closed based on a phase shifting setting of the phase shifter.

In some embodiments, the first port receives a radio frequency input signal and the second port provides a phase-shifted radio frequency output signal.

In various embodiments, the second port receives a radio frequency input signal and the first port provides a phase-shifted radio frequency output signal.

In several embodiments, the first plurality of shunt switches are connected to the first transmission line at a plurality of points having uniform distance from one another.

In some embodiments, the first plurality of shunt switches are connected to the first transmission line at a plurality of points having non-uniform distance from one another. According to a number of embodiments, the distance between adjacent pairs of the plurality of points gradually decreases along a length of the first transmission line.

In various embodiments, the first plurality of shunt switches each have a common size.

In several embodiments, the first plurality of shunt switches each have a different size. According to a number of embodiments, the size of the first plurality of shunt transistors gradually increases along a length of the first transmission line.

In some embodiments, the first transmission line includes a plurality of meandering sections. According to various embodiments, at least one of the plurality of meandering sections includes a loop.

In several embodiments, the second controllable reflective load includes a second transmission line and a second plurality of shunt switches connected along the second transmission line.

In various embodiments, the phase shifter further includes a hybrid coupler including the pair of coupled lines.

In certain embodiments, the present disclosure relates to a method of phase shifting. The method includes receiving a radio frequency input signal at a first port. The method further includes controlling a first controllable reflective load and a second controllable reflective load to control a phase shift of a radio frequency output signal at a second port, the first controllable reflective load including a first transmission line and a first plurality of shunt switches connected along the first transmission line. The method further includes providing coupling between a first conductive line and a second conductive line of a pair of coupled lines, the first conductive line connected between the first port and the first controllable reflective load, and the second conductive line connected between the second controllable reflective load and the second port.

In various embodiments, the first controllable reflective load further includes a first ground conductor on a first side of the first transmission line and a second ground conductor on a second side of the first transmission line. According to several embodiments, each of the first plurality of shunt switches is implemented as a pair of field-effect transistors including a first field-effect transistor connected between the first transmission line and the first ground conductor and a second field-effect transistor connected between the first transmission line and the second ground conductor.

In a number of embodiments, the method further includes closing one or more of the first plurality of shunt switches based on a phase shifting setting of the phase shifter.

In several embodiments, the first plurality of shunt switches are connected to the first transmission line at a plurality of points having uniform distance from one another.

In various embodiments, the first plurality of shunt switches are connected to the first transmission line at a plurality of points having non-uniform distance from one another. According to a number of embodiments, the distance between adjacent pairs of the plurality of points gradually decreases along a length of the first transmission line.

In several embodiments, the first plurality of shunt switches each have a common size.

In some embodiments, the first plurality of shunt switches each have a different size. In accordance with various embodiments, the size of the first plurality of shunt transistors gradually increases along a length of the first transmission line.

In a number of embodiments, the first transmission line includes a plurality of meandering sections. According to several embodiments, at least one of the plurality of meandering sections includes a loop.

In various embodiments, the second controllable reflective load includes a second transmission line and a second plurality of shunt switches connected along the second transmission line.

In some embodiments, the phase shifter further includes a hybrid coupler including the pair of coupled lines.

In certain embodiments, the present disclosure relates to a phase shifter. The phase shifter includes a coupler including an input terminal, a thru terminal, a first coupled line connected between the input terminal and the thru terminal, an isolation terminal, a coupling terminal, and a second coupled line connected between the isolation terminal and the coupling terminal. The phase shifter further includes an input port connected to the input terminal of the coupler and configured to receive a radio frequency input signal, an output port connected to the coupling terminal of the coupler and configured to output a radio frequency output signal having a phase shift with respect to the radio frequency input signal, and a first controllable reflective load connected to the thru terminal of the coupler. The first controllable reflective load includes a transmission line and a plurality of shunt switches each connected between a ground voltage and a different point along the transmission line, the plurality of shunt switches selectable to control the phase shift.

In various embodiments, the first controllable reflective load further includes a first ground conductor on a first side of the transmission line and a second ground conductor on a second side of the transmission line. According to a number of embodiments, each of the plurality of shunt switches is implemented as a pair of field-effect transistors including a first field-effect transistor connected between the transmission line and the first ground conductor and a second field-effect transistor connected between the transmission line and the second ground conductor.

In several embodiments, the plurality of shunt switches are connected to the transmission line at a plurality of points that are non-uniformly spaced. According to a number of embodiments, a distance between adjacent pairs of the plurality of points gradually decreases along a length of the transmission line.

In various embodiments, the plurality of shunt switches each have a different size. According to a number of embodiments, the size of the plurality of shunt transistors gradually increases along a length of the first transmission line.

In several embodiments, the transmission line includes a plurality of meandering sections. According to some embodiments, at least one of the plurality of meandering sections includes a loop.

In a number of embodiments, the phase shifter further includes a second controllable reflective load connected to the isolation terminal of the coupler.

In certain embodiments, the present disclosure relates to a wireless device. The wireless device includes a transceiver, and a front-end system coupled to the transceiver. The front-end system includes a phase shifter including a coupler having an input terminal configured to receive a radio frequency input signal, a thru terminal, a first coupled line connected between the input terminal and the thru terminal, an isolation terminal, a coupling terminal configured to output a radio frequency output signal having a phase shift with respect to the radio frequency input signal, and a second coupled line connected between the isolation terminal and the coupling terminal. The phase shifter further includes a first controllable reflective load connected to the thru terminal of the coupler and including a transmission line and a plurality of shunt switches each connected between a ground voltage and a different point along the transmission line, the plurality of shunt switches selectable to control the phase shift.

In some embodiments, the first controllable reflective load further includes a first ground conductor on a first side of the transmission line and a second ground conductor on a second side of the transmission line. According to a number of embodiments, each of the plurality of shunt switches is implemented as a pair of field-effect transistors including a first field-effect transistor connected between the transmission line and the first ground conductor and a second field-effect transistor connected between the transmission line and the second ground conductor.

In various embodiments, the plurality of shunt switches are connected to the transmission line at a plurality of points that are non-uniformly spaced. According to some embodiments, a distance between adjacent pairs of the plurality of points gradually decreases along a length of the transmission line.

In several embodiments, the plurality of shunt switches each have a different size. According to a number of embodiments, the size of the plurality of shunt transistors gradually increases along a length of the first transmission line.

In some embodiments, the mobile device further includes a second controllable reflective load connected to the isolation terminal of the coupler.

In certain embodiments, the present disclosure relates to a method of phase shifting. The method includes receiving a radio frequency input signal at an input terminal of a coupler. The method further includes providing coupling from a first coupled line of the coupler to a second coupled line of the coupler, the first coupled line connected between the input terminal of the coupler and a thru terminal of the coupler, and the second coupled line connected between an isolation terminal of the coupler and a coupling terminal of the coupler. The method further includes providing a radio frequency output signal from the coupling terminal of the coupler, the radio frequency output signal having a phase shift with respect to the radio frequency input signal. The method further includes controlling the phase shift using a first controllable reflective load connected to the thru terminal of the coupler, including selecting one or more of a plurality of shunt switches of the first controllable reflective load, each of the plurality of shunt switches connected between a ground voltage and a different point along a transmission line of the first controllable reflective load.

In some embodiments, the method further includes controlling a second controllable reflective load connected to the isolation terminal of the coupler.

In certain embodiments, the present disclosure relates to a phase shifter. The phase shifter includes a first port, a second port, a first controllable reflective load, and a second controllable reflective load including a first transmission line and a first plurality of shunt switches connected along the first transmission line. The phase shifter further includes a pair of coupled lines that are electromagnetically coupled to one another. The pair of coupled lines includes a first conductive line connected between the first port and the first controllable reflective load and a second conductive line connected between the second controllable reflective load and the second port.

In various embodiments, the second controllable reflective load further includes a first ground conductor on a first side of the first transmission line and a second ground conductor on a second side of the first transmission line. According to several embodiments, each of the first plurality of shunt switches is implemented as a pair of field-effect transistors including a first field-effect transistor connected between the first transmission line and the first ground conductor and a second field-effect transistor connected between the first transmission line and the second ground conductor.

In a number of embodiments, one or more of the first plurality of shunt switches are closed based on a phase shifting setting of the phase shifter.

In some embodiments, the first port receives a radio frequency input signal and the second port provides a phase-shifted radio frequency output signal.

In several embodiments, the second port receives a radio frequency input signal and the first port provides a phase-shifted radio frequency output signal.

In various embodiments, the first plurality of shunt switches are connected to the first transmission line at a plurality of points having uniform distance from one another.

In some embodiments, the first plurality of shunt switches are connected to the first transmission line at a plurality of points having non-uniform distance from one another. According to a number of embodiments, the distance between adjacent pairs of the plurality of points gradually decreases along a length of the first transmission line.

In several embodiments, the first plurality of shunt switches each have a common size.

In a number of embodiments, the first plurality of shunt switches each have a different size. According to some embodiments, the size of the first plurality of shunt transistors gradually increases along a length of the first transmission line.

In various embodiments, the first transmission line includes a plurality of meandering sections. According to a number of embodiments, at least one of the plurality of meandering sections includes a loop.

In several embodiments, the first controllable reflective load includes a second transmission line and a second plurality of shunt switches connected along the second transmission line.

In some embodiments, the phase shifter further includes a hybrid coupler including the pair of coupled lines.

In certain embodiments, the present disclosure relates to a wireless device. The wireless device includes a transceiver and a front-end system coupled to the transceiver. The front-end system includes a phase shifter including a first port, a second port, a first controllable reflective load, a second controllable reflective load including a first transmission line and a first plurality of shunt switches connected along the first transmission line. The phase shifter further includes a pair of coupled lines that are electromagnetically coupled to one another. The pair of coupled lines includes a first conductive line connected between the first port and the first controllable reflective load and a second conductive line connected between the second controllable reflective load and the second port.

In various embodiments, the second controllable reflective load further includes a first ground conductor on a first side of the first transmission line and a second ground conductor on a second side of the first transmission line. According to a number of embodiments, each of the first plurality of shunt switches is implemented as a pair of field-effect transistors including a first field-effect transistor connected between the first transmission line and the first ground conductor and a second field-effect transistor connected between the first transmission line and the second ground conductor.

In several embodiments, one or more of the first plurality of shunt switches are closed based on a phase shifting setting of the phase shifter.

In various embodiments, the first port receives a radio frequency input signal and the second port provides a phase-shifted radio frequency output signal.

In some embodiments, the second port receives a radio frequency input signal and the first port provides a phase-shifted radio frequency output signal.

In a number of embodiments, the first plurality of shunt switches are connected to the first transmission line at a plurality of points having uniform distance from one another.

In several embodiments, the first plurality of shunt switches are connected to the first transmission line at a plurality of points having non-uniform distance from one another. According to a number of embodiments, the distance between adjacent pairs of the plurality of points gradually decreases along a length of the first transmission line.

In various embodiments, the first plurality of shunt switches each have a common size.

In several embodiments, the first plurality of shunt switches each have a different size. According to some embodiments, the size of the first plurality of shunt transistors gradually increases along a length of the first transmission line.

In a number of embodiments, the first transmission line includes a plurality of meandering sections. According to various embodiments, at least one of the plurality of meandering sections includes a loop.

In some embodiments, the first controllable reflective load includes a second transmission line and a second plurality of shunt switches connected along the second transmission line.

In several embodiments, the phase shifter further includes a hybrid coupler including the pair of coupled lines.

In certain embodiments, a method of phase shifting is provided. The method includes receiving a radio frequency input signal at a first port. The method further includes controlling a first controllable reflective load and a second controllable reflective load to control a phase shift of a radio frequency output signal at a second port, the first controllable reflective load including a first transmission line and a first plurality of shunt switches connected along the first transmission line. The method further includes providing coupling between a first conductive line and a second conductive line of a pair of coupled lines, the first conductive line connected between the first port and the first controllable reflective load, and the second conductive line connected between the second controllable reflective load and the second port.

In several embodiments, the second controllable reflective load further includes a first ground conductor on a first side of the first transmission line and a second ground conductor on a second side of the first transmission line. According to some embodiments, each of the first plurality of shunt switches is implemented as a pair of field-effect transistors including a first field-effect transistor connected between the first transmission line and the first ground conductor and a second field-effect transistor connected between the first transmission line and the second ground conductor.

In a number of embodiments, the method further includes closing one or more of the first plurality of shunt switches based on a phase shifting setting of the phase shifter.

In various embodiments, the first plurality of shunt switches are connected to the first transmission line at a plurality of points having uniform distance from one another.

In several embodiments, the first plurality of shunt switches are connected to the first transmission line at a plurality of points having non-uniform distance from one another. According to a number of embodiments, the distance between adjacent pairs of the plurality of points gradually decreases along a length of the first transmission line.

In various embodiments, the first plurality of shunt switches each have a common size.

In some embodiments, the first plurality of shunt switches each have a different size. According to a number of embodiments, the size of the first plurality of shunt transistors gradually increases along a length of the first transmission line.

In several embodiments, the first transmission line includes a plurality of meandering sections. According to a number of embodiments, at least one of the plurality of meandering sections includes a loop.

In various embodiments, the first controllable reflective load includes a second transmission line and a second plurality of shunt switches connected along the second transmission line.

In some embodiments, the phase shifter further includes a hybrid coupler including the pair of coupled lines.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
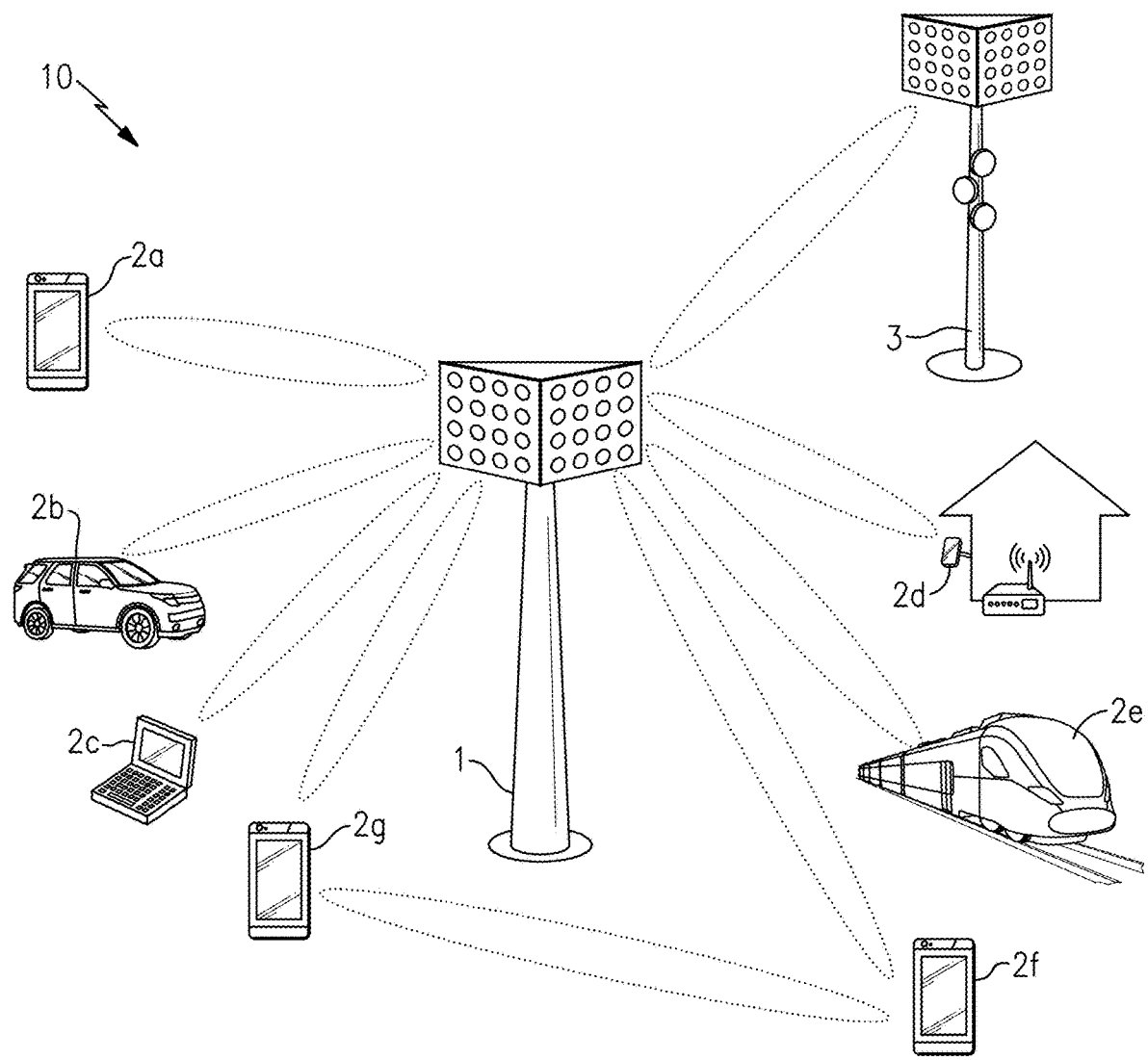
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
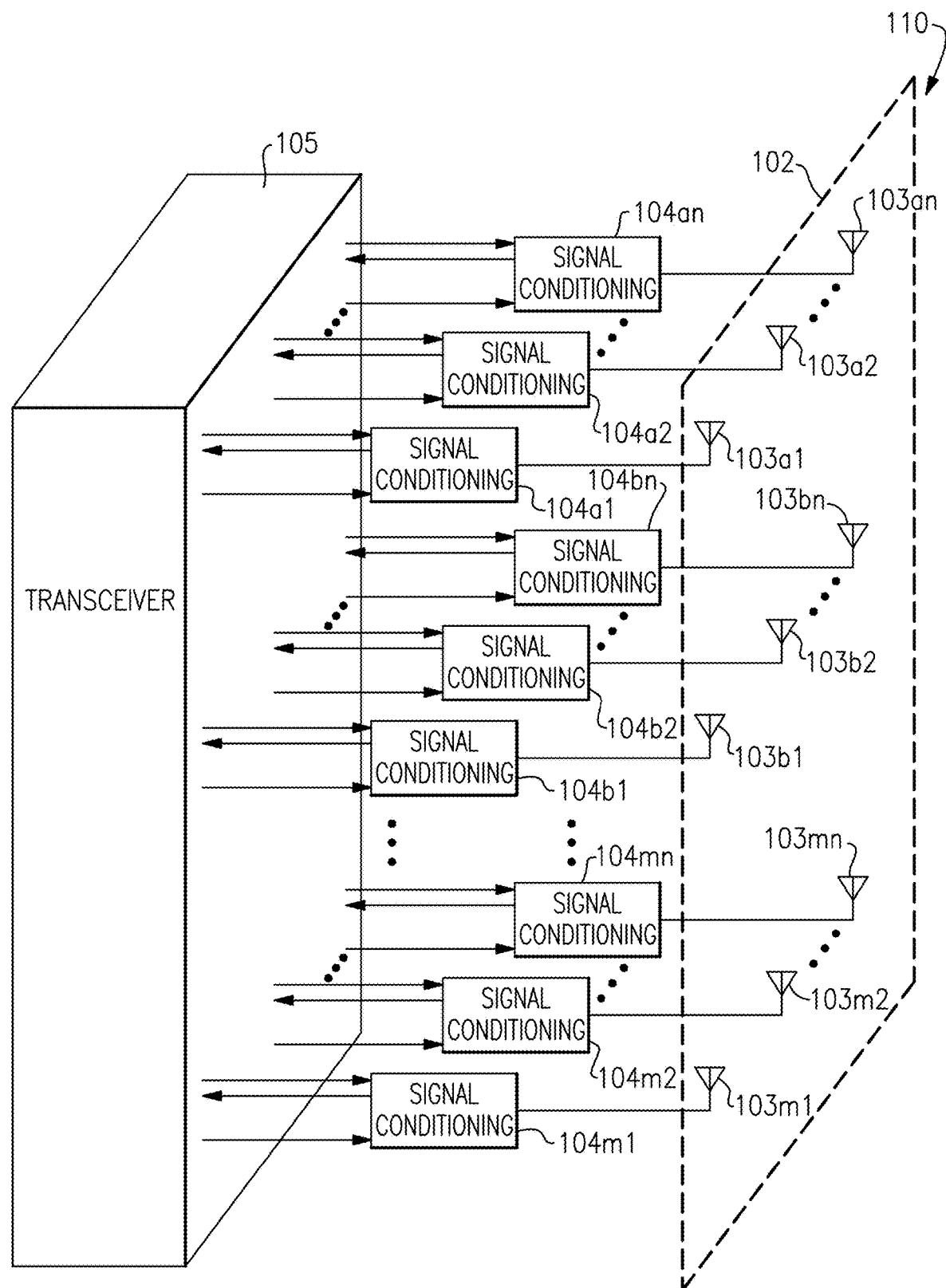
FIG. 2A is a schematic diagram of one embodiment of a communication system that operates with beamforming.

FIG. 2A is a schematic diagram of one embodiment of a communication system 110 that operates with beamforming. The communication system 110 includes a transceiver 105, signal conditioning circuits 104*a*1, 104*a*2 . . . 104*an*, 104*b*1, 104*b*2 . . . 104*bn*, 104*m*1, 104*m*2 . . . 104*mn*, and an antenna array 102 that includes antenna elements 103*a*1, 103*a*2 . . . 103*an*, 103*b*1, 103*b*2 . . . 103*bn*, 103*m*1, 103*m*2 . . . 103*mn*.

Communications systems that communicate using millimeter wave carriers, centimeter wave carriers, and/or other frequency carriers can employ an antenna array such as the antenna array 102 to provide beam formation and directivity for transmission and/or reception of signals.

For example, in the illustrated embodiment, the communication system 110 includes an array 102 of m×n antenna elements, each of which are coupled to a separate signal conditioning circuit, in this embodiment. As indicated by the ellipses, the communication system 110 can be implemented with any suitable number of antenna elements and signal conditioning circuits.

With respect to signal transmission, the signal conditioning circuits 104*a*1, 104*a*2 . . . 104*an*, 104*b*1, 104*b*2 . . . 104*bn*, 104*m*1, 104*m*2 . . . 104*mn* can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits 104*a*1, 104*a*2 . . . 104*an*, 104*b*1, 104*b*2 . . . 104*bn*, 104*m*1, 104*m*2 . . . 104*mn* process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits 104*a*1, 104*a*2 . . . 104*an*, 104*b*1, 104*b*2 . . . 104*bn*, 104*m*1, 104*m*2 . . . 104*mn* and processes signals received from the signal conditioning circuits.

As shown in FIG. 2A, the transceiver 105 generates control signals for the signal conditioning circuits 104a1, 104a2 . . . 104an, 104b1, 104b2 . . . 104bn, 104m1, 104m2 . . . 104mn. The control signals can be used for a variety of functions, such as controlling the gain and phase of transmitted and/or received signals to control beamforming. For example, each of the signal conditioning circuits 104a1, 104a2 . . . 104an, 104b1, 104b2 . . . 104bn, 104m1, 104m2 . . . 104mn can include a phase shifter implemented in accordance with the teachings herein.

Figure 2B:
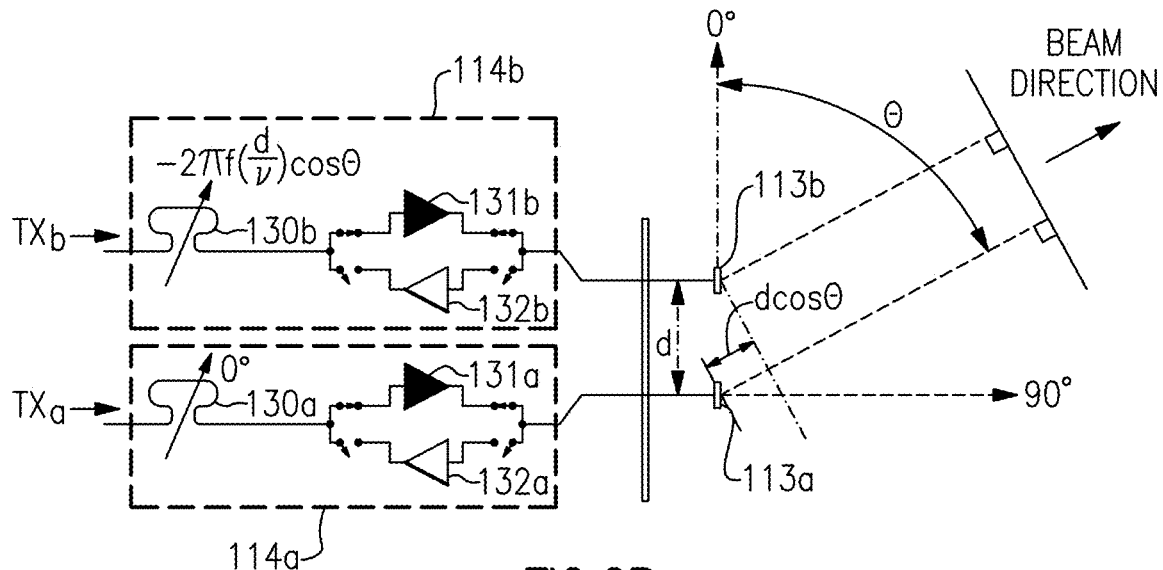
FIG. 2B is a schematic diagram of one embodiment of beamforming to provide a transmit beam.

FIG. 2B is a schematic diagram of one embodiment of beamforming to provide a transmit beam. FIG. 2B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 2B illustrates one embodiment of a portion of the communication system 110 of FIG. 2A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b. The first phase shifter 130a and the second phase shifter 130b can be implemented in accordance with any of the embodiments herein.

Although one embodiment of signal conditioning circuits is shown, other implementations of signal conditioning circuits are possible. For instance, in one example, a signal conditioning circuit includes one or more band filters, duplexers, diplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi \cos\theta$ radians to achieve a transmit beam angle θ.

Accordingly, the relative phase of the phase shifters 130a, 130b can be controlled to provide transmit beamforming. In certain implementations, a transceiver (for example, the transceiver 105 of FIG. 2A) controls phase values of one or more phase shifters to control beamforming.

Figure 2C:
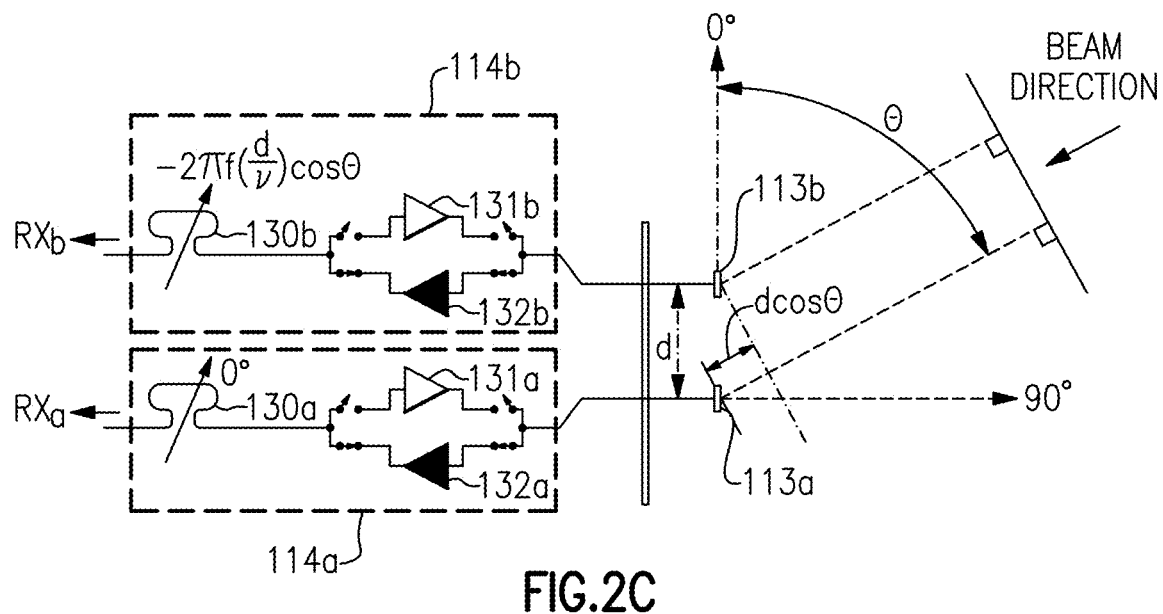
FIG. 2C is a schematic diagram of one embodiment of beamforming to provide a receive beam.

FIG. 2C is a schematic diagram of one embodiment of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ, the phase difference can be selected to about equal to $-\pi \cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Phase Shifters with Switched Transmission Line Loads

Phase shifters are used in radio frequency (RF) systems to provide a controllable phase adjustment to an RF signal.

Phase shifters with switched transmission line loads are provided herein. In certain embodiments, a phase shifter includes a first port, a first controllable reflective load, a second port, a second controllable reflective load, and a pair of coupled lines that are electromagnetically coupled to one another. The pair of coupled lines includes a first conductive line between the first port and the first controllable reflective load and a second conductive line between the second controllable reflective load and the second port. At least one of the first controllable reflective load or the second controllable reflective load includes a switched transmission line load.

By implementing the phase shifter in this manner, high frequency performance (for instance, operation in FR2 such as in the 24 GHz to 30 GHz range) is enabled. Moreover, good return loss can be achieved and/or the return loss can be relatively constant across the range of phase settings of the phase shifter. Furthermore, the group delay of the phase shifter has little to no variation with frequency, and thus does not distort wideband signals.

The first controllable reflective load and the second controllable reflective load are controlled based on a chosen phase setting of the phase shifter. In certain implementations, each controllable reflective load is implemented using a switched transmission line load. Such switched transmission line loads can include a transmission line and shunt switches (for instance, field-effect transistors or FETs) connected between the transmission line and a reference voltage, such as ground. By selecting the combination of switches that are turned on, an effective electrical length of the transmission line can be controlled. As the effective electrical length changes, amount of phase shift provided by the phase shifter is also varied.

The even mode impedance, odd mode impedance, and length of the pair of coupled lines can be adjusted during design to achieve desired performance characteristics. In certain implementations, the pair of coupled lines is implemented as a coupler, such as a 3-dB ninety degree 90° coupler (also referred to herein as a hybrid coupler). The hybrid coupler operates in combination with the controllable reflective loads to achieve desired performance.

The phase shifters herein can be used in a wide variety of applications, including, but not limited to, providing phase shifting in RF signal conditional circuits for a beamforming application.

In certain implementations herein, a phase shifter is configured to provide phase shifting to an RF signal in frequency range 2 (FR2) of 5G, for instance, 24.25 GHz to 52.6 GHz. However, the phase shifters herein can handle other RF signal frequencies.

Figure 3:
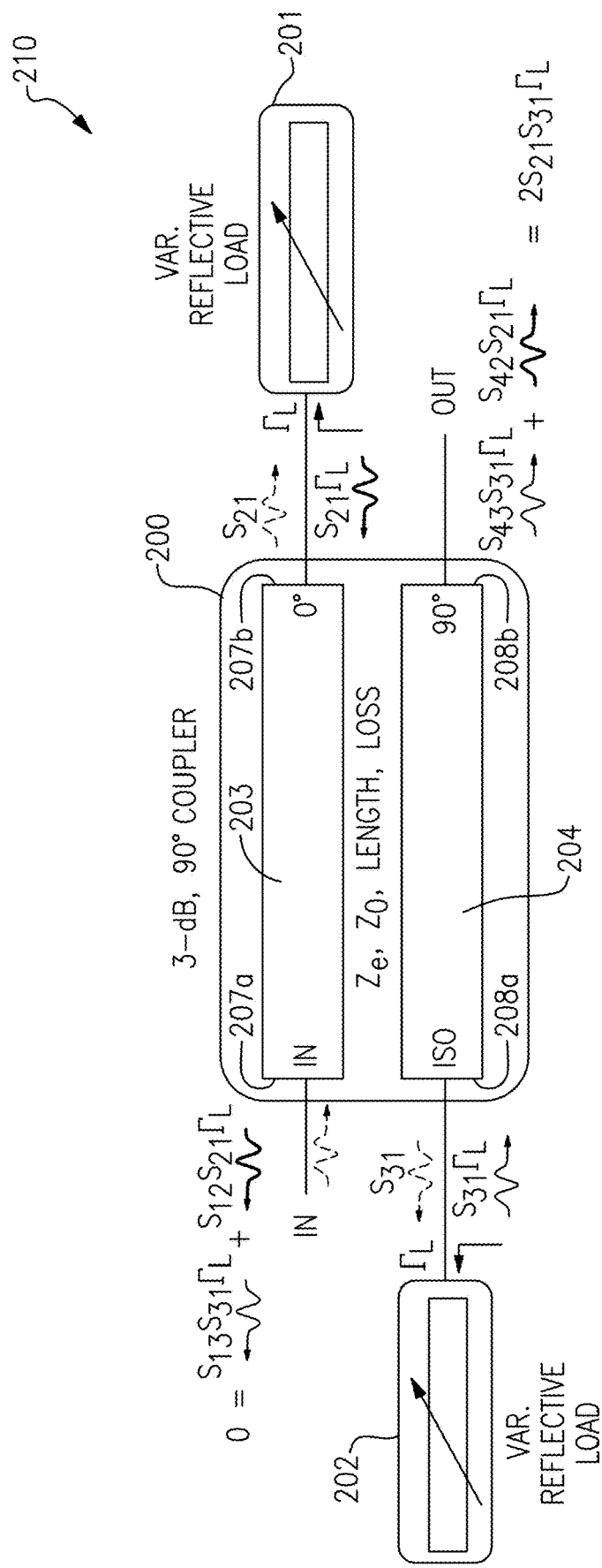
FIG. 3 is a schematic diagram of a phase shifter according to one embodiment.

FIG. 3 is a schematic diagram of a phase shifter 210 according to one embodiment. The phase shifter 210 includes a pair of coupled lines 200 (corresponding to a hybrid coupler, in this embodiment), a first controllable reflective load 201 (also referred to herein as a variable reflective load), a second controllable reflective load 202, an input port IN, and an output port OUT. The coupled lines 200 includes a first conductive line 203 and a second conductive line 204 that are electromagnetically coupled to one another.

In the illustrated embodiment, a first end 207a of the first conductive line 203 is connected to the input port IN and a second end 207b of the first conductive line 203 is connected to the first controllable reflective load 201. Additionally, a first end 208a of the second conductive line 204 is connected to the second controllable reflective load 202 and a second end 208b of the second conductive line 204 is connected to the output port OUT. The first end 207a of the first conductive line 203 and the first end 208a of the second conductive line 204 are on a first side of the coupled lines 200, while the second end 207b of the first conductive line 203 and the second end 208b of the second conductive line 204 are on a second or opposite side of the coupled lines 200.

The pair of coupled lines 200 is implemented as a hybrid coupler, in this embodiment. Additionally, the first end 207a corresponds to an input terminal (IN) of the coupler, the second end 207b corresponds to a thru terminal (0°) of the coupler, the first end 208a corresponds to an isolation terminal (ISO) of the coupler, and the second end 208b corresponds to a coupling terminal (90°) of the coupler.

At least one of the first controllable reflective load 201 or the second controllable reflective load 202 is implemented using a switched transmission line in accordance with the teachings herein.

By implementing the phase shifter 210 in this manner, high frequency performance, good return loss, and/or constant return loss across phase settings can be achieved. Furthermore, the group delay of the phase shifter 210 has little to no variation with frequency, and thus does not distort wideband signals.

In certain implementations, the first controllable reflective load 201 and the second controllable reflective load 202 are controlled based on a chosen phase setting of the phase shifter 210 to thereby change the electrical length of the transmission lines of the reflective loads. For example, the first controllable reflective load 201 and the second controllable reflective load 202 can each be implemented as a switched transmission line controlled by a common control signal.

The even mode impedance, odd mode impedance, and length of the coupled lines 200 can be adjusted during design to achieve desired performance characteristics. The coupled lines 200 operates in combination with the controllable reflective loads 201/202 to achieve desired performance.

Figure 4A:
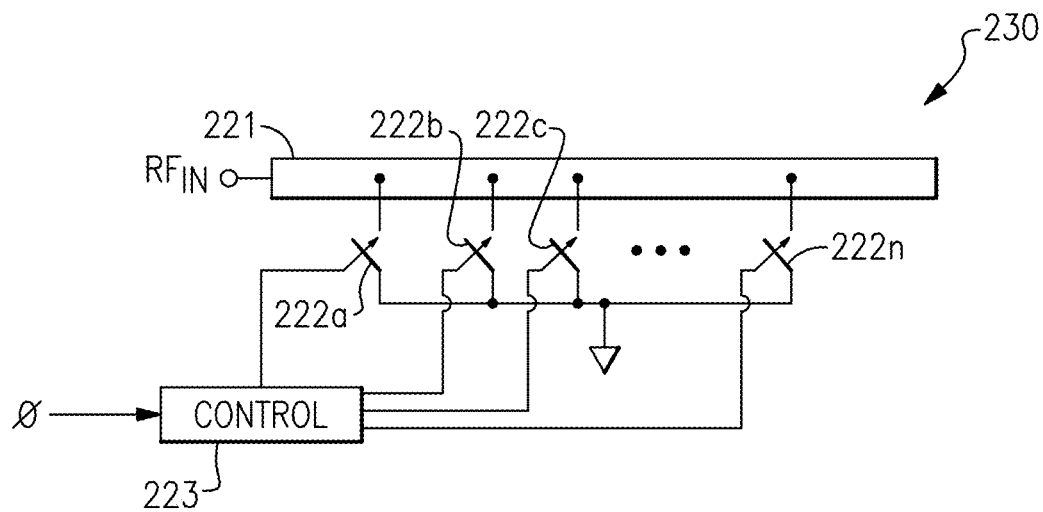
FIG. 4A is a schematic diagram of a switched transmission line according to one embodiment.

FIG. 4A is a schematic diagram of a switched transmission line 230 according to one embodiment. The switched transmission line 230 includes a transmission line 221, an RF input $RF_{IN}$ to the transmission line 221, shunt switches 222a, 222b, 222c, . . . 222n, and a control circuit 223. Thus, n shunt switches are included, where n is an integer of 2 or more, or more preferably, 4 or more.

The switched transmission line 230 of FIG. 4A illustrates one embodiment of a controllable reflective load implemented in accordance with the teachings herein.

In the illustrated embodiment, the control circuit 223 opens or closes the shunt switches 222a, 222b, 222c, . . . 222n based on a selected phase shifting setting φ. The shunt switches 222a, 222b, 222c, . . . 222n are connected to different positions along the transmission line 221. The shunt switches 222a, 222b, 222c, . . . 222n selectively connect the transmission line 221 to ground.

By changing which of the shunt switches 222a, 222b, 222c, . . . 222n are turned on and which are turned off, the electrical length of the transmission line 221 is changed. This in turn impacts the overall phase shift of a reflective type phase shifter in which the switched transmission line 230 is incorporated.

In certain implementations, the control circuit 223 turns on all switches (or at least the shunt switch 222a closest to $RF_{IN}$) to provide the shortest electrical length of the transmission line 221. When starting at a state with all shunt switches closed, progressively longer electrical lengths can be provided by sequentially opening (turning off) the shunt switches, beginning with the switch 222a closest to $RF_{IN}$.

Figure 4B:
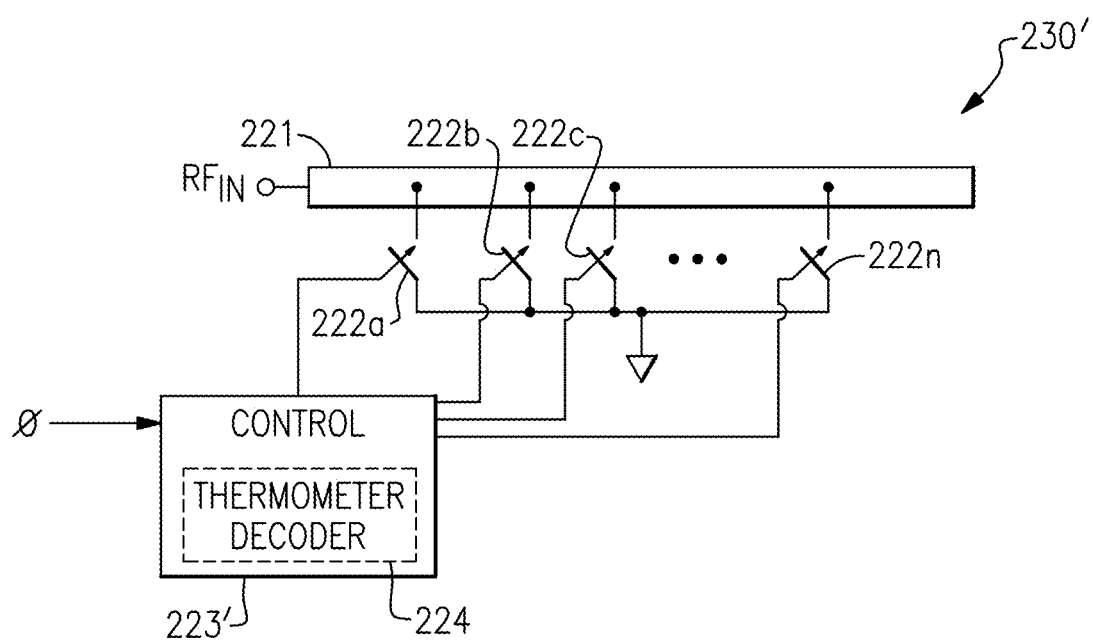
FIG. 4B is a schematic diagram of a switched transmission line according to another embodiment.

FIG. 4B is a schematic diagram of a switched transmission line 230' according to another embodiment.

The switched transmission line 230' of FIG. 4B is similar to the switched transmission line 230 of FIG. 4A, except that the switched transmission line 230' of FIG. 4B includes a control circuit 223' including a thermometer decoder 224.

In certain embodiments herein, a switched transmission line includes shunt switches that are controlled using thermometer coding.

Figure 5A:
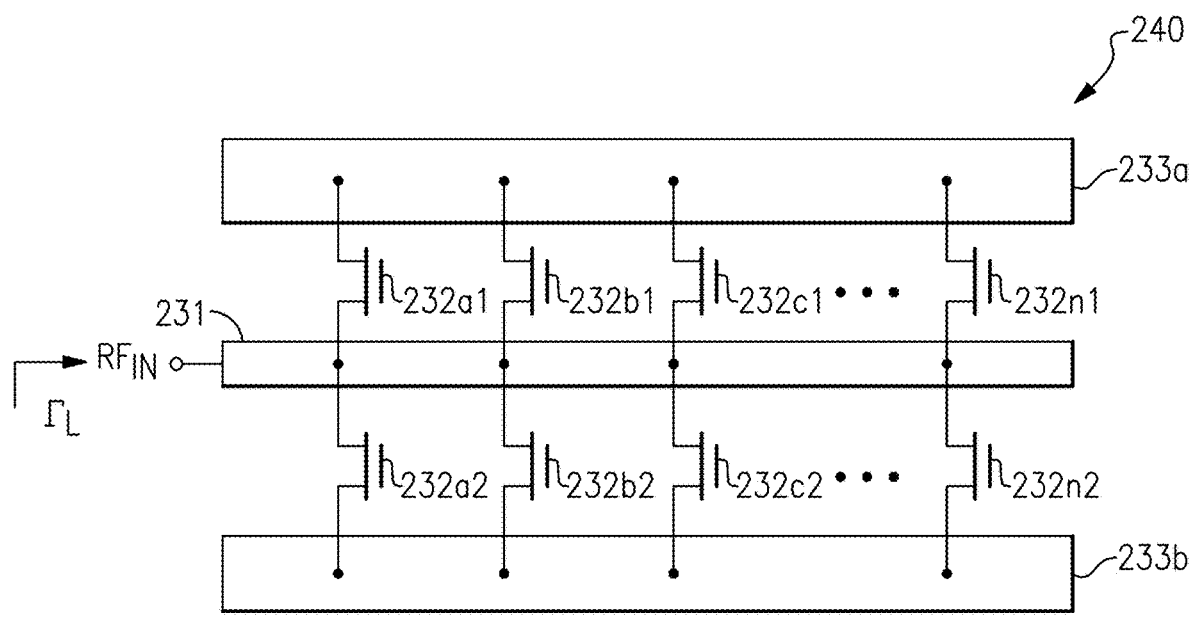
FIG. 5A is a schematic diagram of a switched transmission line according to another embodiment.

FIG. 5A is a schematic diagram of a switched transmission line 240 according to another embodiment. The switched transmission line 240 includes a transmission line 231, a first ground conductor 233a, a second ground conductor 233b, and pairs of FET switches 232a1/232a2, 232b1/232b2, 232c1/232c2, . . . 232n1/232n2. Thus, n pairs of shunt switches are included, where n is an integer of 2 or more, or more preferably, 4 or more.

In comparison to the switched transmission line 230 of FIG. 4A, the switched transmission line 240 of FIG. 5A implements each shunt switch using a pair of FET switches. Additionally, each pair of FET switches includes one FET switch (for instance, FET switch 232a1) connected between the transmission line 231 and the first ground conductor 233a and another FET switch (for instance, FET switch 232a2) connected between the transmission line 231 and the second ground conductor 233b. In certain implementations, each pair of FET switches is commonly controlled by a corresponding control signal (for example, n control signals one for each pair generated by a control circuit, such as the control circuit 223 of FIG. 4A).

By implementing the shunt switches using FETs in the manner depicted, enhanced performance (particularly at high frequencies) is achieved.

Figure 5B:
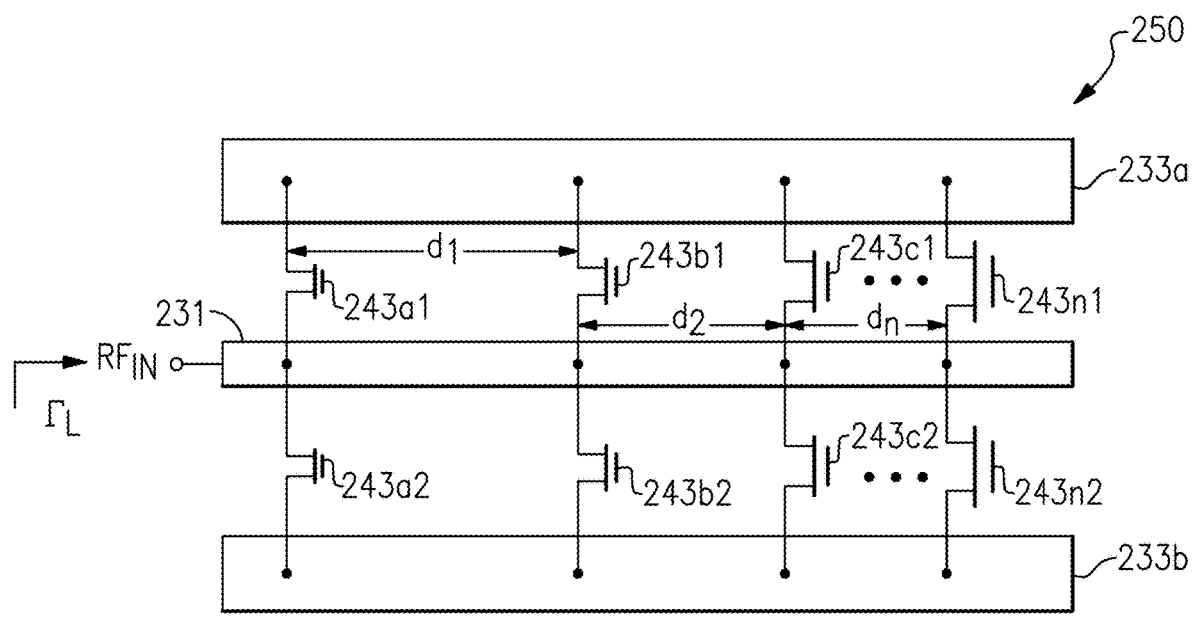
FIG. 5B is a schematic diagram of a switched transmission line according to another embodiment.

FIG. 5B is a schematic diagram of a switched transmission line 250 according to another embodiment. The switched transmission line 250 includes a transmission line 231, a first ground conductor 233a, a second ground conductor 233b, and pairs of FET switches 242a1/242a2, 242b1/242b2, 242c1/242c2, . . . 242n1/242n2.

The switched transmission line 250 of FIG. 5B is similar to the switched transmission line 240 of FIG. 5A, except that the switched transmission line 250 of FIG. 5B includes shunt switches having different sizes (and thus varying on-state resistances and off-state capacitances) and different distances or separations from one another.

Implementing the switched transmission line 250 in this manner provides a number of advantages.

For example, the on-state resistances (Ron) of the shunt switches can be individually selected to keep substantially constant reflection coefficient ($|\Gamma_L|$) over switch states (which correspond to phase shifting settings). In certain implementations, Ron can be decreased as phase shift increases, and thus switches closer to the transmission line's RF input can be smaller (for higher on-state resistance) than switches further from the RF input.

In another example, the lengths of transmission line 231 ($d_1, d_2, \ldots d_n$) between switches are selected to control an amount of phase step between adjacent phase settings.

For instance, 11.25 degrees of phase step at a center frequency of 27 GHz can be achieved by proper selection of the distances between switches.

When implementing the switched transmission line 250, off-state capacitance (Coff) is considered in terms of impact on the characteristic impedance and propagation constant of the transmission line 231. For example, the switches and the transmission line can be designed simultaneously and iteratively.

Figure 6:
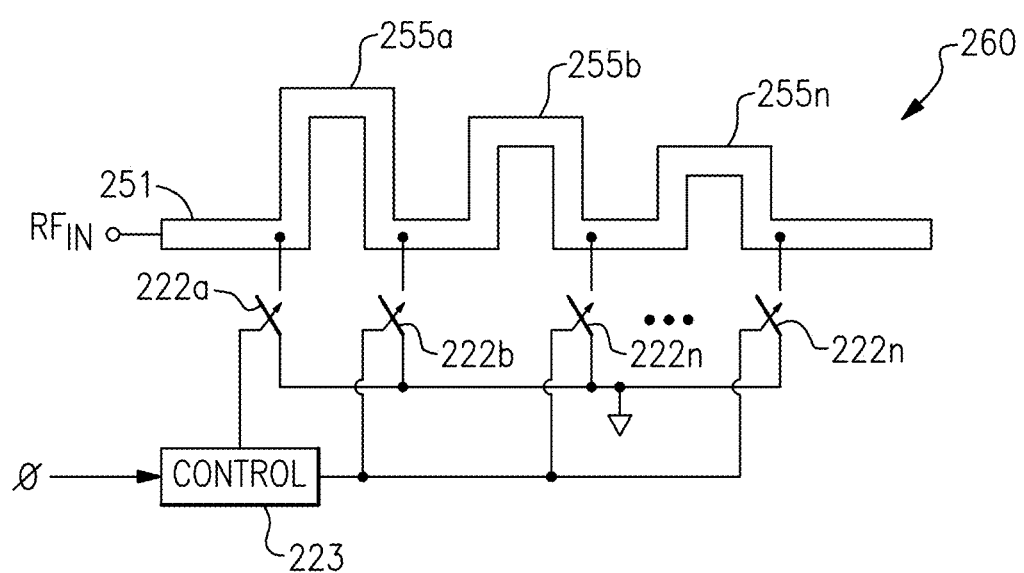
FIG. 6 is a schematic diagram of a switched transmission line according to another embodiment.

FIG. 6 is a schematic diagram of a switched transmission line 260 according to another embodiment. The switched transmission line 260 includes a transmission line 251, an RF input $RF_{IN}$ to the transmission line 251, shunt switches 222a, 222b, 222c, . . . 222n, and a control circuit 223.

The switched transmission line 260 of FIG. 6 is similar to the switched transmission line 230 of FIG. 4A, except that the transmission line 251 shown in FIG. 6 includes sections 255a, 255b, . . . 255n that are meandered to achieve desired phase and/or magnitude response while maintaining a compact layout.

Meandering of a transmission line is also applicable to configurations using pairs of FET switches coupled to a pair of grounding lines. For example, the transmission line 231 of the embodiments of FIGS. 5A and 5B can be meandered in accordance with the teachings herein.

Figure 7:
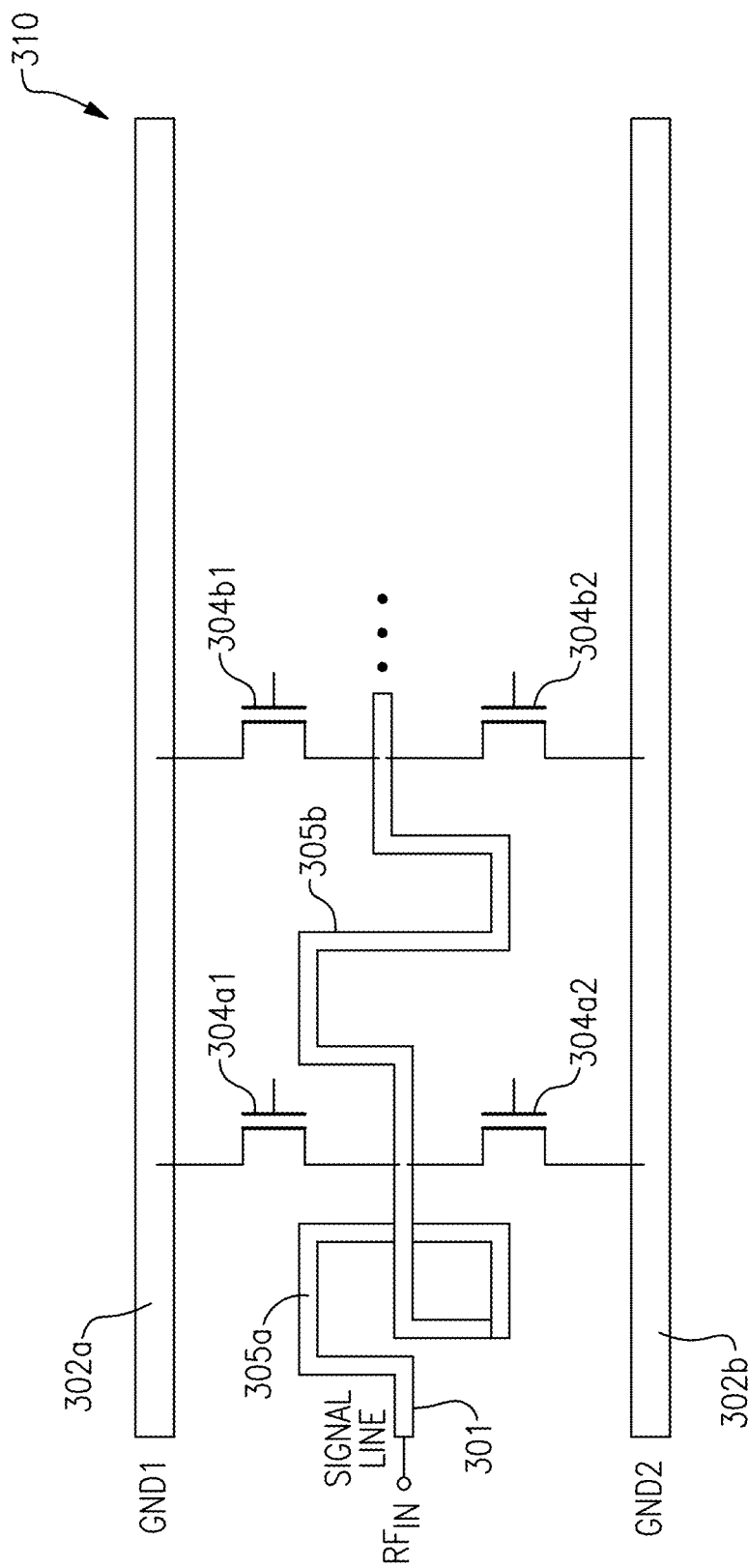
FIG. 7 is a schematic diagram of a switched transmission line according to another embodiment.

FIG. 7 is a schematic diagram of a switched transmission line 310 according to another embodiment. The switched transmission line 310 includes a transmission line 301, a first ground conductor 302a, a second ground conductor 302b, a first pair of switches 304a-304b, and a second pair of switches 305a-305b. Additional pairs of switches can be included as indicated by the ellipsis.

In the example of FIG. 7, the transmission line 301 includes a first section 305a meandered in a small loop and a second section 305b that is meandered without looping. The embodiment of FIG. 7 depicts another example of meandering to achieve desired phase and/or magnitude response while maintaining a compact layout.

A wide variety of performance results can be achieved using the reflective type phase shifters implemented in accordance with the teachings herein.

Table 1 below shows one example results for a phase shifter using switched transmission line loads in accordance with one implementation of FIG. 5B.

Figure 8:
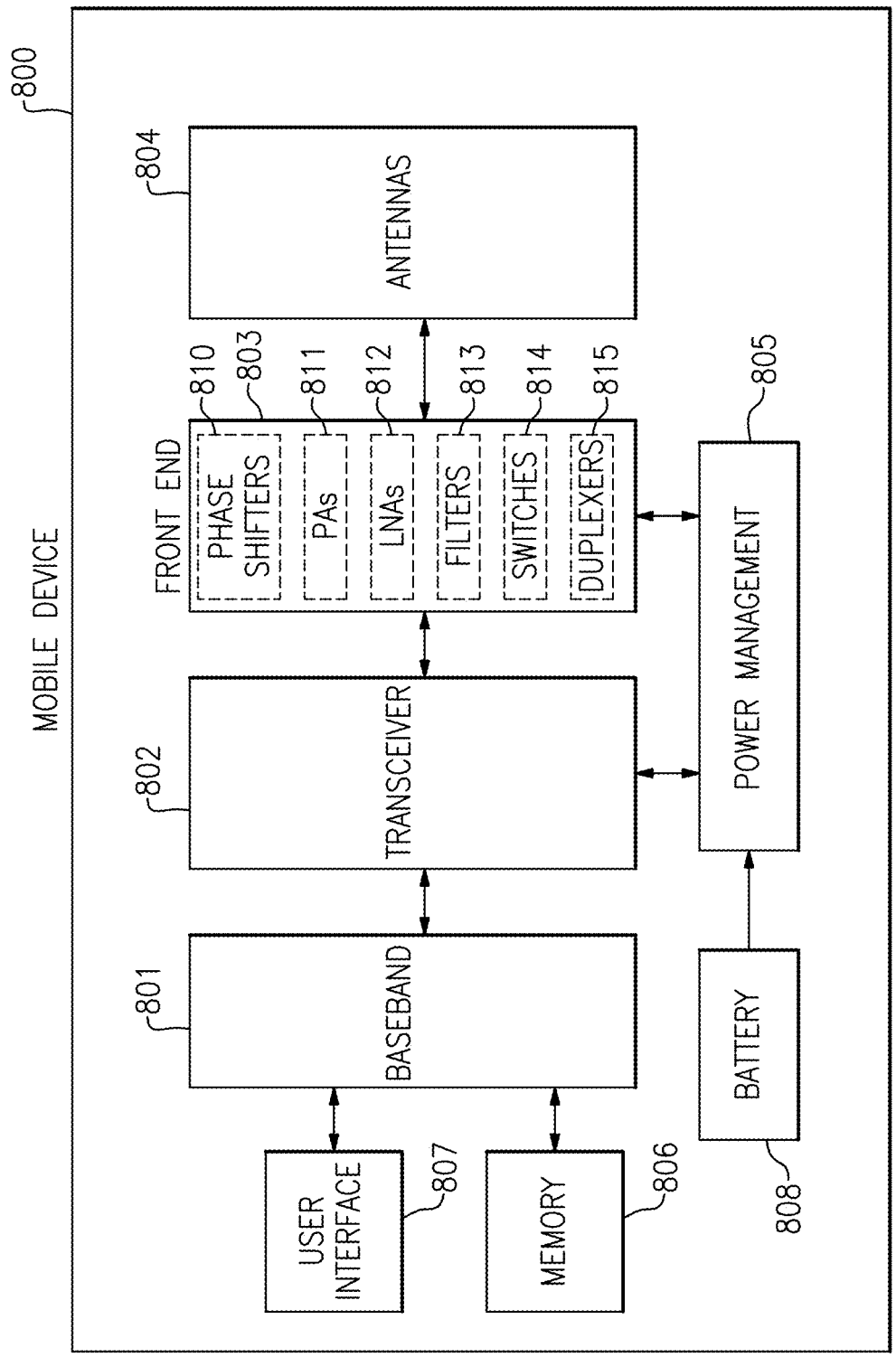
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes phase shifters 810, power amplifiers (PAs) 811, low noise amplifiers (LNAs) 812, filters 813, switches 814, and duplexers 815.

The phase shifters 810 can be implemented in accordance with any of the embodiments herein. However, the phase shifters disclosed herein can be used in other configurations of electronic systems.

The front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device 800 operates with beamforming. For example, the front end system 803 includes phase shifters 810 having variable phase controlled by the transceiver 802. In certain implementations, the transceiver 802 controls the phase of the phase shifters 810 based on data received from the processor 801.

The phase shifters 810 are controlled to provide beam formation and directivity for transmission and/or reception of signals using the antennas 804. For example, in the context of signal transmission, the phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the phases are controlled such

TABLE 1

| | Total Phase Range (deg.) | Phase RMS Error (deg.) | Insertion Loss RMS Error (dB) | Worse Case Insertion Loss Difference Between Two States (dB) | Average Insertion loss (dB) | Worse Case Return Loss on Both Ports (dB) |
|---|---|---|---|---|---|---|
| 24 GHz | 170 | 0.9 | 0.14 | 0.5 | 4.8 | 18 |
| 27 GHz | 191 | 1.1 | 0.2 | 0.65 | 4.9 | 24 |
| 30 GHz | 215 | 1.6 | 0.28 | 0.9 | 5.1 | 18 | that more signal energy is received when the signal is arriving to the antenna array from a particular direction.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9A:
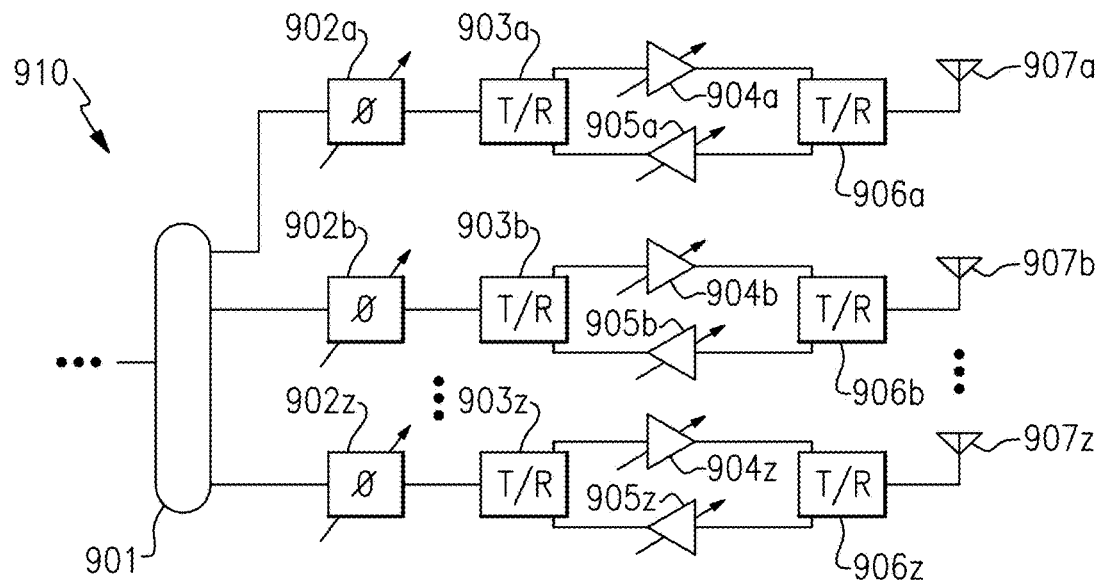
FIG. 9A is a schematic diagram of an RF channel according to one embodiment.

FIG. 9A is a schematic diagram of an RF channel 910 according to one embodiment. The RF channel 910 includes an RF splitter/combiner 901, phase shifters 902a, 902b, . . . 902z, a first group of transmit/receive (T/R) switches 903a, 903b, . . . 903z, power amplifiers 904a, 904b, . . . 904z, low noise amplifiers (LNAs) 905a, 905b, . . . 905z, a second group of T/R switches 906a, 906b, . . . 906z, and antennas 907a, 907b, . . . 907z.

In the illustrated embodiment, T/R switches are used to selecting the power amplifiers for transmit or the LNAs for receive. Thus, the RF channel 910 is suitable for time division duplexing (TDD). Additionally, the RF splitter/combiner 901 is shared for the transmit and receive directions, thus reducing RF signal routes.

Although one embodiment of an RF channel is depicted, the teachings herein are applicable to RF channels implemented in a wide variety of ways. Accordingly, other implementations are possible.

Figure 9B:
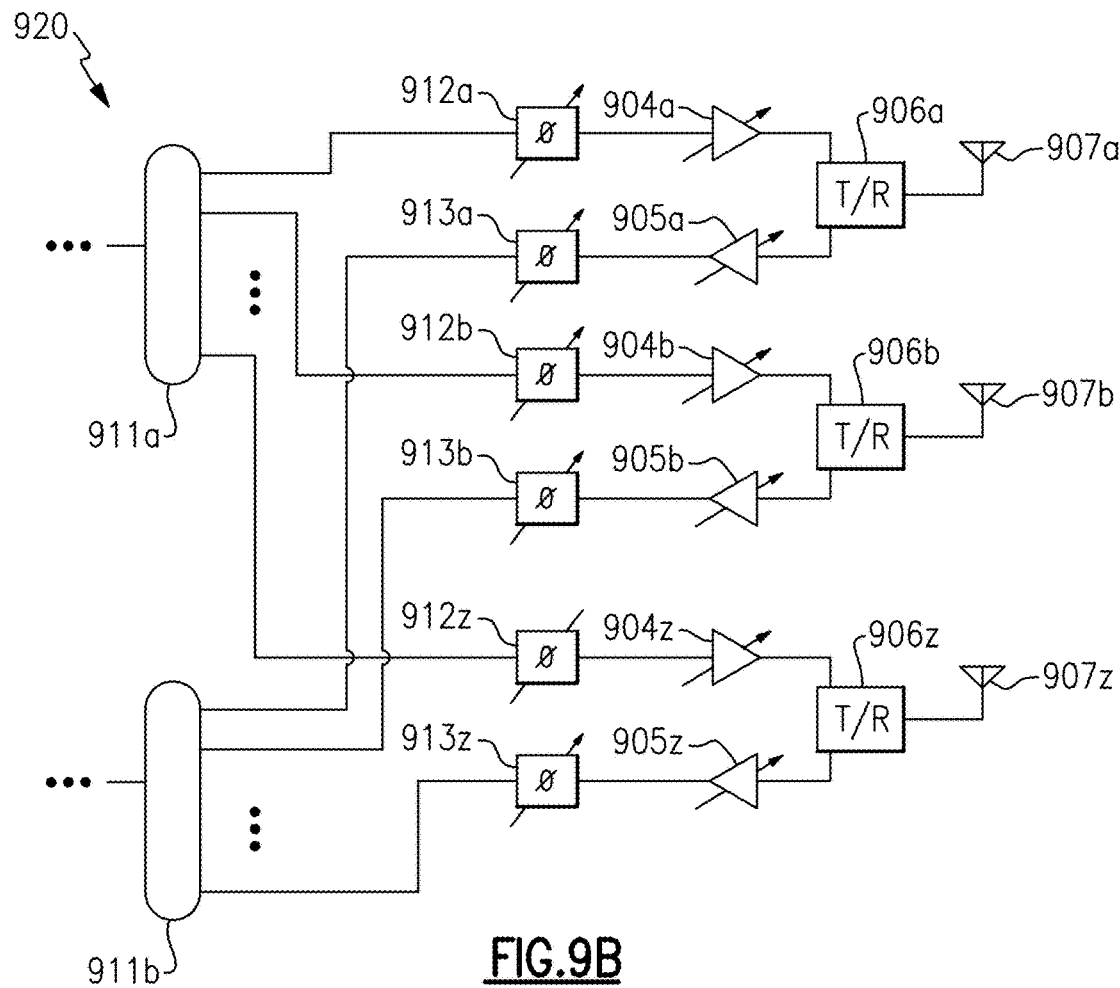
FIG. 9B is a schematic diagram of an RF channel according to another embodiment.

FIG. 9B is a schematic diagram of an RF channel 920 according to another embodiment. The RF channel 920 includes an RF splitter 911a, an RF combiner 911b, a first group of phase shifters 912a, 912b, . . . 912z, a second group of phase shifters 913a, 913b, . . . 913z, power amplifiers 904a, 904b, . . . 904z, LNAs 905a, 905b, . . . 905z, T/R switches 906a, 906b, . . . 906z, and antennas 907a, 907b, . . . 907z.

The RF channel 920 illustrated another embodiment of an RF channel. However, the teachings herein are applicable to RF channels implemented in a wide variety of ways. Accordingly, other implementations are possible.

Figure 10A:
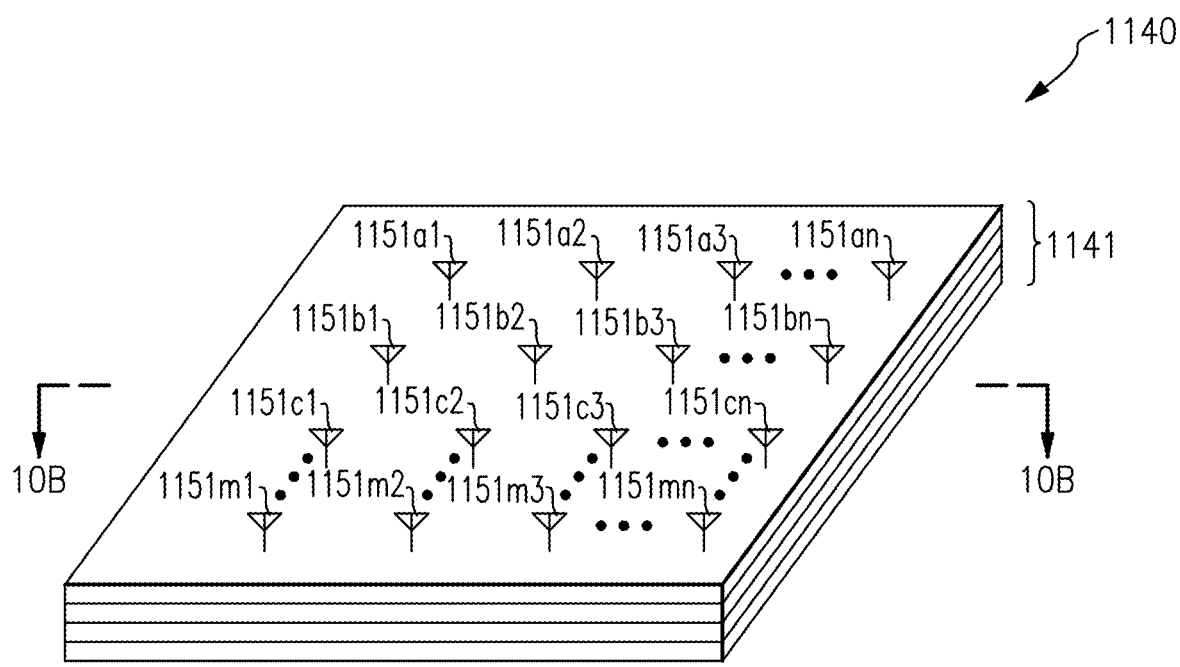
FIG. 10A is a perspective view of one embodiment of a module that operates with beamforming.
Figure 10B:
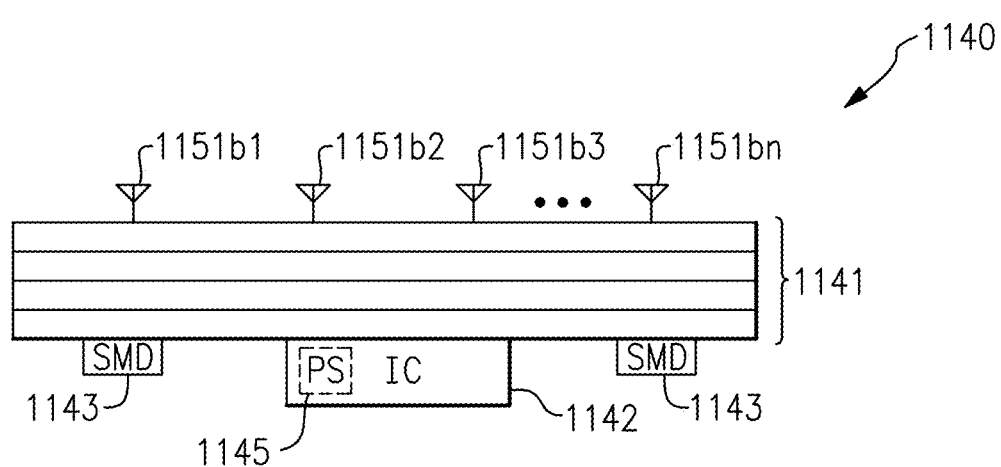
FIG. 10B is a cross-section of the module of FIG. 10A taken along the lines 10B-10B.

FIG. 10A is a perspective view of one embodiment of a module 1140 that operates with beamforming. FIG. 10B is a cross-section of the module 1140 of FIG. 10A taken along the lines 10B-10B.

The module 1140 includes a laminated substrate or laminate 1141, a semiconductor die or IC 1142 (not visible in FIG. 10A), surface mount devices (SMDs) 1143 (not visible in FIG. 10A), and an antenna array including antenna elements 1151a1, 1151a2, 1151a3 . . . 1151an, 1151b1, 1151b2, 1151b3 . . . 1151bn, 1151c1, 1151c2, 1151c3 . . . 1151cn, 1151m1, 1151m2, 1151m3 . . . 1151mn.

Although one embodiment of a module is shown in FIGS. 10A and 10B, the teachings herein are applicable to modules implemented in a wide variety of ways. For example, a module can include a different arrangement of and/or number of antenna elements, dies, and/or surface mount devices. Additionally, the module 1140 can include additional structures and components including, but not limited to, encapsulation structures, shielding structures, and/or wirebonds.

The antenna elements antenna elements 1151a1, 1151a2, 1151a3 . . . 1151an, 1151b1, 1151b2, 1151b3 . . . 1151bn, 1151c1, 1151c2, 1151c3 . . . 1151cn, 1151m1, 1151m2, 1151m3 . . . 1151mn are formed on a first surface of the laminate 1141, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive and/or for different communication bands.

In the illustrated embodiment, the IC 1142 is on a second surface of the laminate 1141 opposite the first surface. However, other implementations are possible. In one example, the IC 1142 is integrated internally to the laminate 1141.

In certain implementations, the IC 142 includes signal conditioning circuits associated with the antenna elements 1151a1, 1151a2, 1151a3 . . . 1151an, 1151b1, 1151b2, 1151b3 . . . 1151bn, 1151c1, 1151c2, 1151c3 . . . 1151cn, 1151m1, 1151m2, 1151m3 . . . 1151mn. Such signal conditioning circuits can include one or more phase shifters 1145 implemented in accordance with the teachings herein.

In one embodiment, the IC 1142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by the phase shifters 1145. In another embodiment, the IC 142 further includes an integrated transceiver.

The laminate 1141 can include various structures including, for example, conductive layers, dielectric layers, and/or solder masks. The number of layers, layer thicknesses, and materials used to form the layers can be selected based on a wide variety of factors, and can vary with application and/or implementation. The laminate 1141 can include vias for providing electrical connections to signal feeds and/or ground feeds of the antenna elements. For example, in certain implementations, vias can aid in providing electrical connections between signal conditioning circuits of the IC 1142 and corresponding antenna elements.

The antenna elements 1151a1, 1151a2, 1151a3 . . . 1151an, 1151b1, 1151b2, 1151b3 . . . 1151bn, 1151c1, 1151c2, 1151c3 . . . 1151cn, 1151m1, 1151m2, 1151m3 . . . 1151mn can correspond to antenna elements implemented in a wide variety of ways. In one example, the array of antenna elements includes patch antenna element formed from a patterned conductive layer on the first side of the laminate 1141, with a ground plane formed using a conductive layer on opposing side of the laminate 1141 or internal to the laminate 1141. Other examples of antenna elements include, but are not limited to, dipole antenna elements, ceramic resonators, stamped metal antennas, and/or laser direct structuring antennas.

The module 1140 can be included in a communication system, such as a mobile phone or base station. In one example, the module 1140 is attached to a phone board of a mobile phone.

Applications

The principles and advantages of the embodiments described herein can be used for a wide variety of applications.

For example, phase shifters can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A phase shifter comprising:
a coupler including an input terminal, a thru terminal, a first coupled line connected between the input terminal and the thru terminal, an isolation terminal, a coupling terminal, and a second coupled line connected between the isolation terminal and the coupling terminal;

an input port connected to the input terminal of the coupler and configured to receive a radio frequency input signal;

an output port connected to the coupling terminal of the coupler and configured to output a radio frequency output signal having a phase shift with respect to the radio frequency input signal; and a first controllable reflective load connected to the thru terminal of the coupler and including a transmission line and a plurality of shunt switches each connected between a ground voltage and a different point along the transmission line, the plurality of shunt switches selectable to control the phase shift, the plurality of shunt switches connected to the transmission line at a plurality of points that are non-uniformly spaced.

2. The phase shifter of claim 1 wherein the first controllable reflective load further includes a first ground conductor on a first side of the transmission line and a second ground conductor on a second side of the transmission line.

3. The phase shifter of claim 2 wherein each of the plurality of shunt switches is implemented as a pair of field-effect transistors including a first field-effect transistor connected between the transmission line and the first ground conductor and a second field-effect transistor connected between the transmission line and the second ground conductor.

4. The phase shifter of claim 1 wherein a distance between adjacent pairs of the plurality of points gradually decreases along a length of the transmission line.

5. The phase shifter of claim 1 wherein the plurality of shunt switches each have a different size.

6. The phase shifter of claim 5 wherein the size of the plurality of shunt switches transistors gradually increases along a length of the first transmission line.

7. The phase shifter of claim 1 wherein the transmission line includes a plurality of meandering sections.

8. The phase shifter of claim 7 wherein at least one of the plurality of meandering sections includes a loop.

9. The phase shifter of claim 1 further comprising a second controllable reflective load connected to the isolation terminal of the coupler.

10. A mobile device comprising:
a transceiver; and
a front-end system coupled to the transceiver, the front-end system including a phase shifter that includes a coupler having an input terminal configured to receive a radio frequency input signal, a thru terminal, a first coupled line connected between the input terminal and the thru terminal, an isolation terminal, a coupling terminal configured to output a radio frequency output signal having a phase shift with respect to the radio frequency input signal, and a second coupled line connected between the isolation terminal and the coupling terminal, the phase shifter further including a first controllable reflective load connected to the thru terminal of the coupler and including a transmission line and a plurality of shunt switches each connected between a ground voltage and a different point along the transmission line, the plurality of shunt switches selectable to control the phase shift, the plurality of shunt switches connected to the transmission line at a plurality of points that are non-uniformly spaced.

11. The mobile device of claim 10 wherein the first controllable reflective load further includes a first ground conductor on a first side of the transmission line and a second ground conductor on a second side of the transmission line.

12. The mobile device of claim 11 wherein each of the plurality of shunt switches is implemented as a pair of field-effect transistors including a first field-effect transistor connected between the transmission line and the first ground conductor and a second field-effect transistor connected between the transmission line and the second ground conductor.

13. The mobile device of claim 10 wherein a distance between adjacent pairs of the plurality of points gradually decreases along a length of the transmission line.

14. The mobile device of claim 10 wherein the plurality of shunt switches each have a different size.

15. The mobile device of claim 14 wherein the size of the plurality of shunt switches gradually increases along a length of the first transmission line.

16. The mobile device of claim 10 wherein the phase shifter further includes a second controllable reflective load connected to the isolation terminal of the coupler.

17. A method of phase shifting, the method comprising:
receiving a radio frequency input signal at an input terminal of a coupler;
providing coupling from a first coupled line of the coupler to a second coupled line of the coupler, the first coupled line connected between the input terminal of the coupler and a thru terminal of the coupler, and the second coupled line connected between an isolation terminal of the coupler and a coupling terminal of the coupler;
providing a radio frequency output signal from the coupling terminal of the coupler, the radio frequency output signal having a phase shift with respect to the radio frequency input signal; and
controlling the phase shift using a first controllable reflective load connected to the thru terminal of the coupler, including selecting one or more of a plurality of shunt switches of the first controllable reflective load, each of the plurality of shunt switches connected between a ground voltage and a different point along a transmission line of the first controllable reflective load, the plurality of shunt switches connected to the transmission line at a plurality of points that are non-uniformly spaced.

18. The method of claim 17 further comprising controlling a second controllable reflective load connected to the isolation terminal of the coupler.

19. The method of claim 17 wherein a distance between adjacent pairs of the plurality of points gradually decreases along a length of the transmission line.

20. The method of claim 17 wherein the plurality of shunt switches each have a different size, the size of the plurality of shunt switches gradually increasing along a length of the first transmission line.

* * * * *

UNITED STATES PATENT AND TRADEMARK OFFICE
CERTIFICATE OF CORRECTION

PATENT NO. : 11,791,800 B2
APPLICATION NO. : 17/455086
DATED : October 17, 2023
INVENTOR(S) : Mostafa Azizi et al.

It is certified that error appears in the above-identified patent and that said Letters Patent is hereby corrected as shown below:

In the Claims

In Column 23, Claim 6, Line 33, after "switches" delete "transistors".

Signed and Sealed this
Second Day of January, 2024

Katherine Kelly Vidal
Director of the United States Patent and Trademark Office